United States Patent [19]

Sadigh-Behzadi

[11] 4,406,508
[45] Sep. 27, 1983

[54] DUAL-IN-LINE PACKAGE ASSEMBLY

[75] Inventor: Amir-Akbar Sadigh-Behzadi, Van Nuys, Calif.

[73] Assignee: Thomas & Betts Corporation, Raritan, N.J.

[21] Appl. No.: 279,943

[22] Filed: Jul. 2, 1981

[51] Int. Cl.³ .......................................... H01R 23/68
[52] U.S. Cl. ............................. 339/75 M; 339/17 CF
[58] Field of Search .......... 339/17 CF, 75 M, 75 MP, 339/176 M, 176 MP; 174/52 FP

[56] References Cited

U.S. PATENT DOCUMENTS

| | | | |
|---|---|---|---|
| 3,605,062 | 9/1971 | Tinkelenberg et al. | 339/17 CF |
| 3,611,269 | 10/1971 | Reed | 339/17 CF |
| 3,846,734 | 11/1974 | Pauza et al. | 339/176 MP |
| 3,951,495 | 4/1976 | Donaher et al. | 339/17 |
| 4,018,494 | 4/1977 | Scheingold et al. | 339/17 |
| 4,045,105 | 8/1977 | Lee et al. | 339/17 |
| 4,080,026 | 3/1978 | Gianni | 339/17 |
| 4,116,518 | 9/1978 | Pleskac | 339/17 |
| 4,116,519 | 9/1978 | Grabbe et al. | 339/17 |
| 4,356,532 | 10/1982 | Donaher et al. | 339/17 CF |
| 4,364,620 | 12/1982 | Mulholland et al. | 339/17 CF |

FOREIGN PATENT DOCUMENTS 1550797 12/1968 France .
2039160 7/1980 United Kingdom ............. 339/75 M Primary Examiner—John McQuade
Attorney, Agent, or Firm—Robert M. Rodrick; Salvatore J. Abbruzzese; Jesse Woldman

[57] ABSTRACT

A dual-in-line package assembly for interconnection with a printed circuit board includes a base having a plurality of free-standing contacts and a DIP carrier having channels extending therethrough for jointly receiving DIP lead and base contacts and for biasing resililent portions of the base contacts upon the DIP leads interiorly of the carrier. The channels of carriers stacked in the assembly have common base contacts passing therethrough in registry with a lead of each stacked package.

9 Claims, 5 Drawing Figures

DUAL-IN-LINE PACKAGE ASSEMBLY

FIELD OF THE INVENTION

This invention relates generally to electrical interconnection and pertains more particularly to assemblies for interconnecting electronic packages to printed circuit boards (PCBs) and the like substrates.

BACKGROUND OF THE INVENTION

A wide variety of arrangements is presently known for providing interconnection between electrical contacts situated in a PCB with the leads or pins of an electronic package, typically a dual-in-line package (DIP) or other type of integrated circuit (IC) chip with supporting carrier. In a first such prior art approach, a base receives the DIP and has contacts therein which both engage the DIP leads interiorly of the base and extend outwardly of the base undersurface to seat in the PCB contacts. This approach is seen in U.S. Pat. No. 4,116,519.

So-called "stacking" of DIPs, a measure of current interest in the conservation of PCB real estate whereby plural electronic packages are disposed in tandem above the PCB, is accommodated in U.S. Pat. No. 4,116,519 interconnect scheme, since the base and its contacts are of sufficient height above the PCB to receive plural packages and to engage the leads of each package in parallel circuit arrangement. The U.S. Pat. No. 4,116,519 patent base contacts are, however, of flat blade configuration throughout their longitudinal extent and are disposed contiguously with the base sidewalls. Accordingly, the base contacts are immobilized and hence are passive during DIP insertion, the electrical contact resistance and the DIP retention force in the assembly thus being entirely dependent upon spring force arising from flexing of the DIP leads against the base contacts.

In a second approach akin to that of U.S. Pat. No. 4,116,519, and shown in U.S. Pat. No. 4,116,518, the base is provided in "clothes pin" fashion with a compression spring forcing closure of the base onto the DIP leads. The base again includes contacts immobilized therein and passive during asembly, as in the U.S. Pat. No. 4,116,519 approach. Electrical contact resistance is thus again derived from flexing of the DIP leads against the base contacts upon closure of the base onto the DIP leads.

While both such first and second prior art approaches are structurally simpler than other approaches in the prior art which either require plural sets of base contacts for accommodating the stacking of plural electronic packages or the interfitting of DIP leads of each package with those of another package and then with base contacts, a shortcoming common to known simplified approaches, as alluded to above, resides in their dependence upon the flexing and the flexure strength of the DIP leads for establishing assembly electrical contact resistance and retention force for containment of the DIPs in the assembly. Nor is the situation abetted by customary removal and reinsertion of the packages wherein it becomes necessary to re-deflect the previously bent DIP leads to render them suitable for re-flexing upon reinsertion. Clearly, the structurally simpler known approaches rely upon an operational capability of DIP package leads, i.e., flexure strength, not part of the design specifications thereof.

SUMMARY OF THE INVENTION

The present invention has as its primary object the provision of improved electronic package assemblies.

A more particular object of the invention is to provide electronic package assemblies of simplified structure akin to that discussed above, but wherein electrical contact resistance and package retention force characteristics are achieved without dependence upon DIP lead flexing or DIP lead flexure strength.

In attaining the foregoing and other objects, the present invention provides an electronic package assembly wherein the base thereof supports, a plurality of contacts defining resilient contact portions distal from the DIP support surface of the base. A DIP carrier has contact-effecting means therein for joint receipt of the leads of the DIP and the base contacts and for biasing the resilient contact portions upon the DIP leads. Electrical contact resistance in the assembly of carrier and base is thus established without dependence upon the flexure of DIP leads but, rather, is derived from flexure of base contacts, which are provided with such flexure strength.

The DIP carrier of the invention embodies such contact-effecting means preferably in the form of channels therein adapted for such joint DIP lead and base contact residence. Bases in accordance with the invention support such base contacts in manner to register with the carrier channels.

The DIP carrier and base of the invention further may include cooperate detent means providing the retentive force independently of the DIP leads and base contact engagement.

The foregoing and other features of the invention will be further evident from the following detailed description of preferred embodiments thereof and from the drawings wherein like reference numerals identify like parts throughout.

DESCRIPTION OF THE PREFERRED EMBODIMENTS

Figure 1:
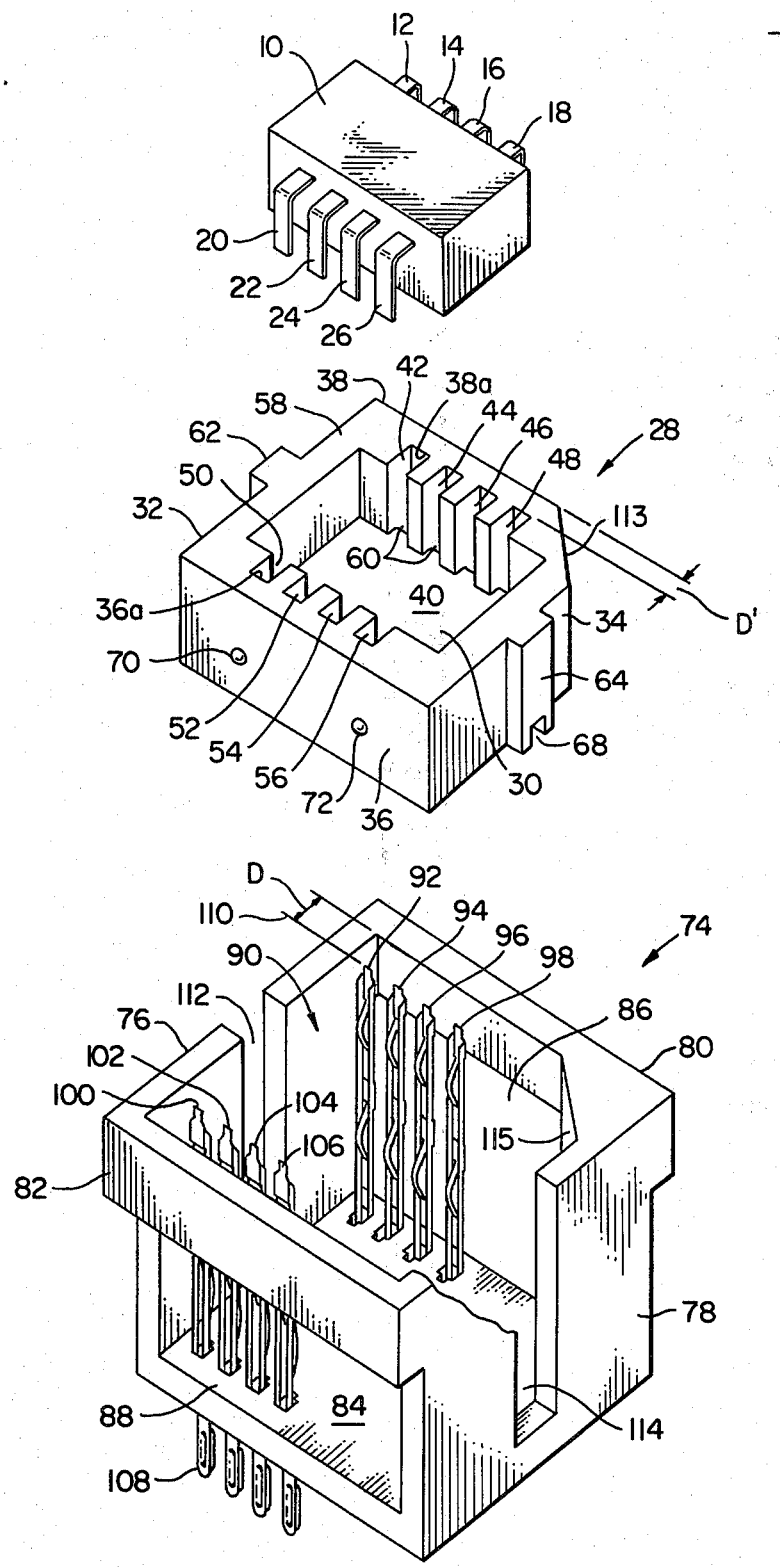
FIG. 1 is an exploded view of components comprising an electronic package assembly in accordance with the invention.

Referring to FIG. 1, electronic package 10, which is shown in the form of a DIP, has pins or leads 12–26 depending downwardly outwardly therefrom and mutually separated at preselected industry-adopted spacing.

Carrier 28 has upwardly open recess 30 bounded by end walls 32 and 34, sidewalls 36 and 38 and DIP support surface 40. Channels 42–56 are spacedly aligned in opposed first and second rows in side walls 36 and 38, correspondingly with leads 12–26, and open upwardly through carrier top surface 58 to permit insertion of leads 12–26 therethrough into residence in the channels. At its downward end, each channel opens through surface 40 to be accessible from beneath carrier 28, such opening being indicated typically at 60. End walls 32 and 34 have guides 62 (FIG. 5) and 64 extending respectively outwardly thereof, the guides including slots 66 (FIG. 5) and 68 for handling purposes. Dimples extend outwardly of sidewalls 36 and 38 for detent purposes, the sidewall 36 dimples being shown at 70 and 72.

Base 74 includes full upstanding end walls 76 and 78 and sidewalls 80 and 82 extending partially downwardly with the end walls outboard of the sides of carrier support surface 84 of base 74. Side openings 86 and 88 are thus formed between end walls 76 and 78, giving rise to an open-sided compartment 90 in base 74. A plurality of contacts 92-106, spacedly aligned in first and second rows correspondingly with channels 42-56, extends upwardly into compartment 90, lower end portions of the contacts extending through and downwardly of support surface 84 to define exteriorly accessible assembly terminals 108, which may be seated in a printed circuit board or like substrate for electrical connection of the assembly to companion circuitry.

Contacts 92-106 extend in free-standing fashion upwardly of support surface 84, inboard of sidewalls 80 and 82 by a preselected measure. Thus, considering contacts 92-98, their outer back surfaces are aligned with line 110 which is spaced from the interior surface of sidewall 80 by the distance D. Such distance D is slightly greater than distance D', which is the distance between interior surfaces of carrier sidewall 38 partly bounding channels 42-48, i.e., surface 38a, and the outboard surface of wall 38. Accordingly, contacts 92-98 register with openings 60 to enter channels 42-48 on assembly of the FIG. 1 components, with sidewall surfaces 38a in contiguous relation to contacts 92-98. Base end walls 76 and 78 have respective tracks 112 and 114 formed therein and extending vertically from support surface 84 to upper open ends. Base compartment 90 has an inner transverse perimeter corresponding to the exterior transverse perimeter of carrier 28 for nesting of carrier 28 snugly within base 74. To provide for polarized receipt of carrier 28 by base 74, keying surfaces 113 and 115 are formed at corresponding locations on carrier 28 and base 74.

Figure 3:
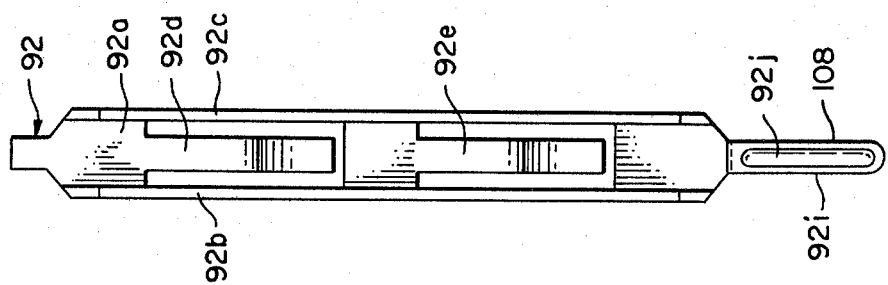
FIG. 3 is a front elevation of the FIG. 2 contact.
Figure 2:
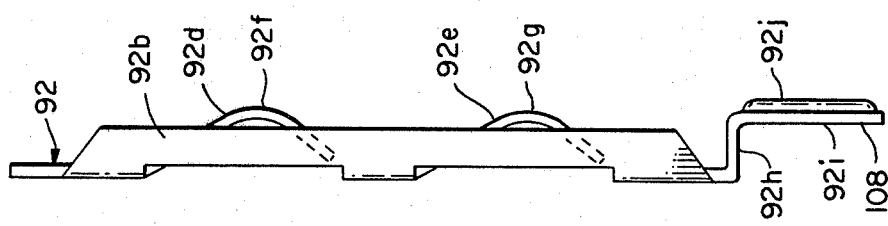
FIG. 2 is a side elevation of a contact used in the FIG. 1 assembly.

Turning to FIGS. 2 and 3, contact 92 is elongate, including a flat central plate 92a from which are formed contact side flanges 92b and 92c. The flanges extend generally fully longitudinally with the plate, thus giving rise to a strut having U-shaped cross-section along most of its length and thereby providing the contact with free-standing capability. For use with a plural, i.e., stacked, DIP assembly as will be discussed in connection with FIGS. 4 and 5, the contact has plural mutually longitudinally spaced resilient portions 92d and 92e struck from central plate 92a and configured to define respective arcuate contact surfaces 92f and 92g, which extend beyond side flanges 92b and 92c. As will be seen, if central plate 92a is immobilized against transverse movement leftwardly in FIG. 2, compressive force upon contact surface 92f, for example, will give rise to leftward transverse displacement of resilient portion 92d and biased engagement of contact surface 92f and of the element applying the compressive force. Downwardly of side flanges 92b and 92c, contact 92 includes a seating surface 92h extending transversely to the longitudinally extending end portion above identified as assembly terminal 108 in FIG. 1, comprised of flat stem 92i and front embossment 92j.

Figure 5:
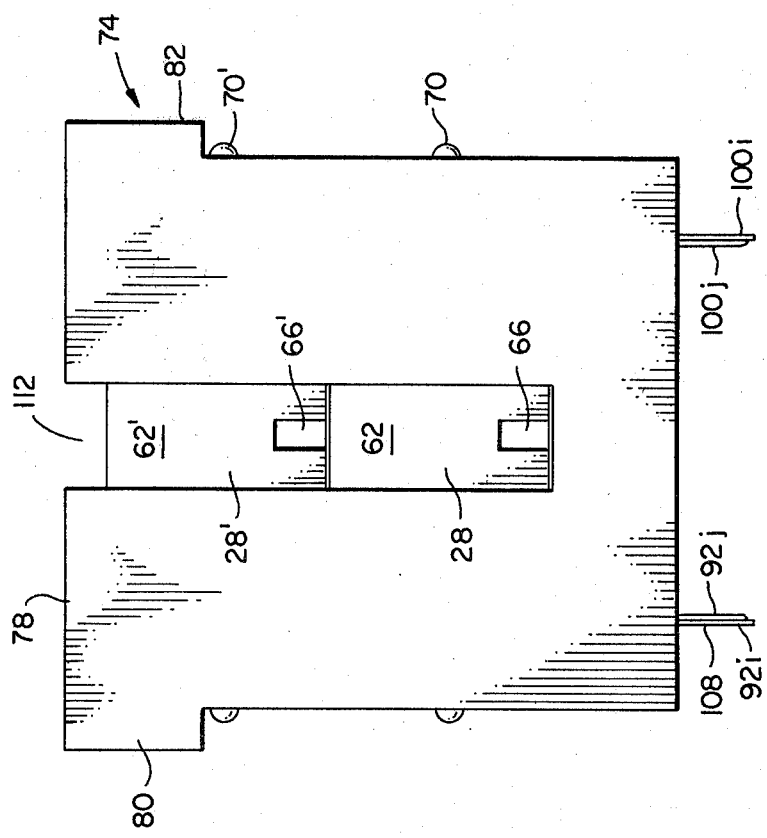
FIG. 5 is an end elevation of the FIG. 4 electronic package assembly.
Figure 4:
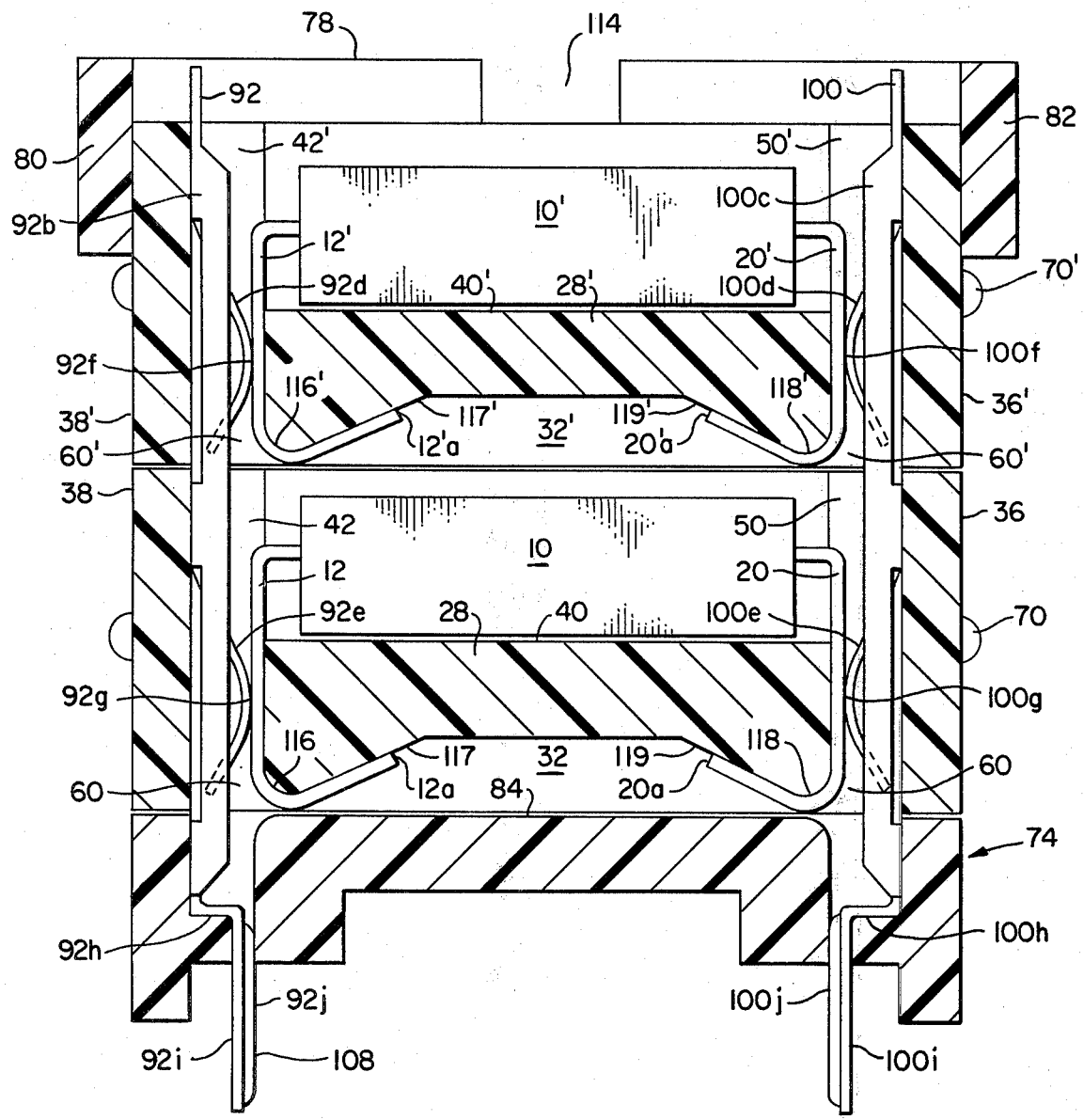
FIG. 4 is a typical sectional view of the preferred electronic package assembly of the invention.

In FIGS. 4 and 5, an electronic package assembly in accordance with the invention includes identical plural DIPs with identical carriers. For brevity, the reference numerals used above in identifying features of DIP 10 and carrier 28 are primed to identify corresponding parts of DIP 10' and carrier 28'. The showing in FIG. 4 is a sectioned view taken immediately leftwardly in FIG. 1 of contacts 92 and 100 with the components assembled. DIPs 10 and 10' are shown in full outline rather than in section, as they may have any given interior structure.

In reaching the FIG. 4 assembly, carrier 28 is first assembled with DIP 10, leads 12 and 20 of DIP 10 (and all other leads of DIP 10) extending through openings 60 and around carrier arcuate surfaces 116 and 118 and being tightly dressed thereupon. This practice has several effects. Firstly, it disposes the leads inwardly in precise position in the carrier channels. Secondly, it provides a bearing surface for the leads, i.e., the sidewalls continuous with surfaces 116 and 118, whereby connection will be made without bending or like flexure stress upon the DIP pins. Thirdly, the ends 12a and 20a of the DIP leads are tucked away, so to speak, being contiguous, respectively, with carrier surface extents 117 and 119 continuous with the arcuate surfaces and are thereby prevented from snagging or the like during handling of the DIP carrier.

With DIP 10 so assembled therewith, carrier 28 is placed atop base 74 in polarized registry with compartment 90 and with guides 62 and 64 in tracks 112 and 114. Based on the selection of distances D and D' and selection of cross-sectional expanse of the carrier channels to provide for joint residence in each thereof of a DIP lead and at least the central plate and side flanges of the base contacts, the base contacts register with the outboard expanses of the channels and carrier 28 may be forced downwardly, DIP lead 12 first compressing and then releasing such compressive force on upper arcuate contact surface 92f and thereafter compressing lower arcuate contact surface 92g. Biased electrical connection is thus provided as between DIP lead 12 and surface 92g and between DIP lead 20 and arcuate contact surface 100g.

The carrier insertion activity renders the carrier channels operative as connection-effecting means, wherein the channels transversely immobilize the contact strut and, based on such selection of channel cross-sectional expanse, the channels force the strut resilient portion (92e, 100e) against the also transversely immobilized package lead (10,12), giving rise to compression of the resilient portion into closer transverse disposition to the strut. The outward bounding wall (36a, 38a) of the channel serves as a reaction-bearing surface, thus providing the counter reaction to contact compression, namely, bias by the contact resilient portion upon the package lead and hence biased engagement thereof without flexing of the package lead.

In the stacked assembly of FIGS. 4 and 5, the foregoing pre-assembly of DIP and carrier and insertion practices are repeated for the upper DIP 10'. As the lower and upper contact resilient portions are successively distal from the base support surface, they register respectively with the lower and upper DIP leads.

As is seen in FIG. 5, retention force for retaining DIP carriers 28 and 28' in base 74 arises as dimple 70 emerges from the underside of sidewall 82 on insertion of DIP 28' and detents below the sidewall. Such retention force is provided independently of the engagements of base contacts and package leads. To release the assembly, a suitable tool may be inserted in carrier opening 66' and the carrier 28' opening opposite same, and an upwardly directed force is applied to carrier 28'. As walls 82 and 80 are only end-fixed, they are readily flexed outwardly by the carrier dimples during such release action. All component parts of the assemblies hereof, other than the base contacts and package leads, are of electrically-insulative material, such as a suitable plastic.

Various modifications to the foregoing particularly described structures will now be evident to those skilled in the art, and may be introduced without departing from the invention. Thus, the foregoing preferred embodiments discussed and shown in the drawings are intended in an illustrative and not in a limiting sense. The true spirit and scope of the invention is set forth in the following claims.

What is claimed is:

1. An electronic package assembly, comprising:
   (a) a base having a support surface and a plurality of contacts supported thereon in preselected mutual spacing, each said contact defining first and second resilient contact portions successively distal from said support surface; and
   (b) first and second electronic package carriers stackably received by said base and respectively registrable with said first and second contact resilient portions, each such carrier and said base defining cooperative surfaces for polarized receipt of said first and second package carriers by said base, each such carrier having connection-effecting means for boundingly jointly receiving the leads of a package carried thereby and said base contacts, and for individually biasing said contact resilient portions registered therewith into engagement with said package leads interiorly of said carriers.

2. The invention claimed in claim 1 wherein each said connection-effecting means comprises a plurality of channels arranged in said preselected mutual spacing and having opposite open ends, said channels extending through such package carrier and adapted for opposite-end receipt respectively of said package leads and said base contacts.

3. The invention claimed in claim 2 wherein each such carrier channel is of such cross-sectional expanse as to effect compression of such resilient contact portion into such biased engagement with the package lead commonly resident therewith in said channel.

4. The invention claimed in claim 3 wherein each said package carrier defines arcuate surface extent in contiguous relation with portions of said package leads therein.

5. The invention claimed in claim 4 wherein each said package carrier further defines further surface extent continuous with said arcuate surface extent and contiguous with end portions of said package leads therein.

6. The invention claimed in claim 5 wherein said base contacts extend through said base support surface and define base terminals of said package assembly accessible exteriorly of said base.

7. The invention claimed in claim 1 wherein each said package carrier includes guide means extending outwardly thereof and wherein said base includes track means jointly for effecting receipt of said package carrier by said base.

8. An electronic package assembly, comprising:
   (a) a base having a support surface and a plurality of contacts supported thereon in preselected mutual spacing, each said contact defining first and second resilient contact portions successively distal from said support surface; and
   (b) first and second electronic package carriers stackably received by said base and respectively registrable with said first and second contact resilient portions, each such carrier having connection-effecting means for boundingly jointly receiving the leads of a package carried thereby and said base contacts, and for individually biasing said contact resilient portions registered therewith into engagement with said package leads interiorly of said carriers, said second package carrier and said base jointly providing detent means independently of said package leads and said base contacts for retention of said first and second carriers in said base.

9. An electronic package assembly, comprising:
   (a) an electronic component package having a plurality of spaced leads depending outwardly along a side of said package;
   (b) a carrier defining a support surface for said package and a plurality of channels mutually spaced correspondingly with such lead spacing and adapted for individually receiving said leads, and an outer wall of preselected thickness partially bounding each said channel, said channels being disposed between such carrier wall and said support surface; and
   (c) an upstanding base having a support surface for said carrier, a plurality of contacts extending upwardly beyond said support surface and mutually spaced correspondingly with said channels for entering same, and an outer wall having its interior surface spaced from said contacts by a measure exceeding said preselected carrier wall thickness, whereby said package may be assembled with said carrier with said leads disposed in said channels and said carrier then insertable in said housing, said contacts thereupon entering said channels and electrically engaging said leads.

* * * * *